United States Patent
Lin

(10) Patent No.: US 7,573,773 B2
(45) Date of Patent: Aug. 11, 2009

(54) FLASH MEMORY WITH DATA REFRESH TRIGGERED BY CONTROLLED SCRUB DATA READS

(75) Inventor: Jason T. Lin, Santa Clara, CA (US)

(73) Assignee: Sandisk Corporation, Milpitas, CA (US)

( * ) Notice: Subject to any disclaimer, the term of this patent is extended or adjusted under 35 U.S.C. 154(b) by 66 days.

(21) Appl. No.: 11/692,829

(22) Filed: Mar. 28, 2007

(65) Prior Publication Data

US 2008/0239851 A1    Oct. 2, 2008

(51) Int. Cl.
*G11C 11/34* (2006.01)
(52) U.S. Cl. ............. 365/222; 365/185.02; 365/185.01; 365/189.07; 365/201
(58) Field of Classification Search ............ 365/189.02, 365/185.04, 185.07, 185.17, 185.24, 185.03, 365/185.18, 185.21
See application file for complete search history.

(56) References Cited

U.S. PATENT DOCUMENTS

| | | | |
|---|---|---|---|
| 4,139,911 A | 2/1979 | Sciulli et al. |
| 4,218,764 A | 8/1980 | Furuta et al. |
| 4,253,059 A | 2/1981 | Bell et al. |
| 4,460,982 A | 7/1984 | Gee et al. |
| 4,612,630 A | 9/1986 | Rosier |
| 4,694,454 A | 9/1987 | Matsuura |
| 4,703,196 A | 10/1987 | Arakawa |
| 4,703,453 A | 10/1987 | Shinoda et al. |
| 4,733,394 A | 3/1988 | Giebel |
| 4,763,305 A | 8/1988 | Kuo |
| 4,779,272 A | 10/1988 | Kohda et al. |
| 4,799,195 A | 1/1989 | Iwahashi et al. |
| 4,809,231 A | 2/1989 | Shannon et al. |
| 4,827,450 A | 5/1989 | Kowalski |
| 4,937,787 A | 6/1990 | Kobatake |
| 4,962,322 A | 10/1990 | Chapman |

(Continued)

FOREIGN PATENT DOCUMENTS

EP        0 791 933 B1    6/1999

(Continued)

OTHER PUBLICATIONS

USPTO, "Office Action," mailed in related U.S. Appl. No. 11/692,829, filed Apr. 17, 2008, 16 pages.

(Continued)

*Primary Examiner*—Pho M. Luu
*Assistant Examiner*—Tha-O Bui
(74) *Attorney, Agent, or Firm*—Davis Wright Tremaine LLP

(57) ABSTRACT

The quality of data stored in individual blocks of memory cells of a flash memory system is monitored by a scrub read of only a small portion of a block, performed after data are read from less than all of a block in response to a read command from a host or memory controller. The small portion is selected for the scrub read because of its greater vulnerability than other portions of the block to being disturbed as a result of the commanded partial block data read. This then determines, as the result of reading a small amount of data, whether at least some of the data in the block was disturbed by the command data read to a degree that makes it desirable to refresh the data of the block.

9 Claims, 8 Drawing Sheets

U.S. PATENT DOCUMENTS

| | | |
|---|---|---|
| 4,964,079 A | 10/1990 | Devin |
| 4,975,883 A | 12/1990 | Baker et al. |
| 5,043,940 A | 8/1991 | Harari |
| 5,065,364 A | 11/1991 | Atwood et al. |
| 5,070,032 A | 12/1991 | Yuan et al. |
| 5,095,344 A | 3/1992 | Harari |
| 5,119,330 A | 6/1992 | Tanagawa |
| 5,122,985 A | 6/1992 | Santin |
| 5,132,935 A | 7/1992 | Ashmore, Jr. |
| 5,151,906 A | 9/1992 | Sawada |
| 5,157,629 A | 10/1992 | Sato et al. |
| 5,172,338 A | 12/1992 | Mehrotra et al. |
| 5,200,922 A | 4/1993 | Rao |
| 5,200,959 A | 4/1993 | Gross et al. |
| 5,239,505 A | 8/1993 | Fazio et al. |
| 5,262,984 A | 11/1993 | Noguchi et al. |
| 5,263,032 A | 11/1993 | Porter et al. |
| 5,270,551 A | 12/1993 | Kamimura et al. |
| 5,270,979 A | 12/1993 | Harari et al. |
| 5,278,794 A | 1/1994 | Tanaka et al. |
| 5,313,421 A | 5/1994 | Guterman et al. |
| 5,313,427 A | 5/1994 | Schreck et al. |
| 5,315,541 A | 5/1994 | Harari et al. |
| 5,321,655 A | 6/1994 | Iwahashi et al. |
| 5,327,383 A | 7/1994 | Merchant et al. |
| 5,335,198 A | 8/1994 | Van Buskirk et al. |
| 5,341,334 A | 8/1994 | Maruyama |
| 5,343,063 A | 8/1994 | Yuan et al. |
| 5,347,489 A | 9/1994 | Merchant et al. |
| 5,365,486 A | 11/1994 | Schreck |
| 5,377,147 A | 12/1994 | Merchant et al. |
| 5,394,359 A | 2/1995 | Kowalski |
| 5,404,485 A | 4/1995 | Ban |
| 5,465,236 A | 11/1995 | Naruke |
| 5,475,693 A | 12/1995 | Christopherson et al. |
| 5,504,760 A | 4/1996 | Harari et al. |
| 5,523,972 A | 6/1996 | Rashid et al. |
| 5,532,962 A | 7/1996 | Auclair et al. |
| 5,570,315 A | 10/1996 | Tanaka et al. |
| 5,583,812 A | 12/1996 | Harari |
| 5,648,934 A | 7/1997 | O'Toole |
| 5,652,720 A | 7/1997 | Aulas et al. |
| 5,657,332 A | 8/1997 | Auclair et al. |
| 5,661,053 A | 8/1997 | Yuan |
| 5,675,537 A | 10/1997 | Bill et al. |
| 5,689,465 A | 11/1997 | Sukegawa et al. |
| 5,699,297 A | 12/1997 | Yamazaki et al. |
| 5,703,506 A | 12/1997 | Shook et al. |
| 5,712,815 A | 1/1998 | Bill et al. |
| 5,715,193 A | 2/1998 | Norman |
| 5,717,632 A | 2/1998 | Richart et al. |
| 5,751,639 A | 5/1998 | Ohsawa |
| 5,761,125 A | 6/1998 | Himeno |
| 5,774,397 A | 6/1998 | Endoh et al. |
| 5,798,968 A | 8/1998 | Lee et al. |
| 5,835,413 A | 11/1998 | Hurter et al. |
| 5,890,192 A | 3/1999 | Lee et al. |
| 5,905,673 A | 5/1999 | Khan |
| 5,909,449 A | 6/1999 | So et al. |
| 5,930,167 A | 7/1999 | Lee et al. |
| 5,937,425 A | 8/1999 | Ban |
| 5,963,473 A | 10/1999 | Norman |
| 6,046,935 A | 4/2000 | Takeuchi et al. |
| 6,145,051 A | 11/2000 | Estakhri et al. |
| 6,151,246 A | 11/2000 | So et al. |
| 6,199,139 B1 | 3/2001 | Katayama et al. |
| 6,222,762 B1 | 4/2001 | Guterman et al. |
| 6,345,001 B1 | 2/2002 | Mokhlesi |
| 6,415,352 B1 | 7/2002 | Asami et al. |
| 6,426,893 B1 | 7/2002 | Conley et al. |
| 6,456,528 B1 | 9/2002 | Chen |
| 6,522,580 B2 | 2/2003 | Chen et al. |
| 6,560,152 B1 | 5/2003 | Cernea |
| 6,567,307 B1 | 5/2003 | Estakhri |
| 6,678,785 B2 | 1/2004 | Lasser |
| 6,728,134 B2 * | 4/2004 | Ooishi ................... 365/185.03 |
| 6,760,255 B2 | 7/2004 | Conley et al. |
| 6,763,424 B2 | 7/2004 | Conley |
| 6,772,274 B1 | 8/2004 | Estakhri |
| 6,925,007 B2 | 8/2005 | Harari et al. |
| 6,963,505 B2 | 11/2005 | Cohen |
| 7,012,835 B2 * | 3/2006 | Gonzalez et al. ....... 365/185.11 |
| 7,477,547 B2 | 1/2009 | Lin |
| 2005/0073884 A1 | 4/2005 | Gonzalez et al. |
| 2006/0039196 A1 * | 2/2006 | Gorobets et al. ....... 365/185.01 |
| 2006/0062048 A1 * | 3/2006 | Gonzalez et al. ....... 365/185.11 |
| 2006/0233023 A1 | 10/2006 | Lin et al. |
| 2007/0211532 A1 | 9/2007 | Gonzalez et al. |
| 2008/0158968 A1 | 7/2008 | Moogat et al. |
| 2008/0158969 A1 | 7/2008 | Moogat et al. |

FOREIGN PATENT DOCUMENTS

| | | |
|---|---|---|
| GB | 2289779 A | 11/1995 |
| JP | 8-147988 | 6/1996 |
| JP | 8-279295 | 10/1996 |
| JP | 2000-187992 | 7/2000 |
| WO | WO 9012400 | 10/1990 |
| WO | WO 02/058074 | 7/2002 |

OTHER PUBLICATIONS

EPO/ISA, "Notification of Transmittal of the International Search Report and the Written Opinion of the International Searching Authority, or the Declaration," corresponding International Patent Application No. PCT/US2008/057422, mailed on Jul. 8, 2008, 12 pages.

Lee, E.K.F., et al., "Error Correction Technique for Multivalued MOS Memory," *Electronic Letters*, vol. 27, No. 15 (Jul. 19, 1991) pp. 1321-1323.

* cited by examiner

FLASH MEMORY WITH DATA REFRESH TRIGGERED BY CONTROLLED SCRUB DATA READS

CROSS REFERENCE TO RELATED APPLICATION

This application is related to application No. 11/692,840, filed on Mar. 28, 2007, by Jason Lin, entitled "Flash Memory Refresh Techniques Triggered by Controlled Scrub Data Reads," now patent No. 7,477,547, which application is incorporated herein in its entirety by this reference.

BACKGROUND

The subject matter herein relates generally to techniques of refreshing data stored in re-programmable non-volatile memory, and, more specifically, to the correction and refresh of stored data in response to potential disturbs of the data that can be caused by reading other data.

There are many commercially successful non-volatile memory products being used today, particularly in the form of small form factor cards and flash drives with an interface according to the Universal Serial Bus (USB) standard. They individually employ an array of flash EEPROM (Electrically Erasable and Programmable Read Only Memory) cells formed on one or more integrated circuit chips. A memory controller, usually but not necessarily on a separate integrated circuit chip, interfaces with a host to which the card is removably connected and controls operation of the memory array within the card. Such a controller typically includes a microprocessor, some non-volatile read-only-memory (ROM), a volatile random-access-memory (RAM) and one or more special circuits such as one that calculates an error-correction-code (ECC) from data as they pass through the controller during the programming and reading of data.

Examples of such memory cards are those sold by SanDisk Corporation, the assignee hereof, under the trademarks CompactFlash™ (CF) cards, MultiMedia cards (MMC), Secure Digital (SD) cards, miniSD cards, micro SD cards, TransFlash cards and Memory Stick cards. Several different USB flash drives are available from SanDisk under its Cruzer trademark. Hosts include personal computers, notebook computers, personal digital assistants (PDAs), various data communication devices, digital cameras, cellular telephones, portable audio players, automobile sound systems, and similar types of equipment. Besides the memory card and flash drive formats, this type of memory system can alternatively be embedded into various types of host systems. Many types of memory cards and flash drives are capable of executing application programs alone, or in conjunction with a host.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in U.S. Pat. Nos. 5,070,032, 5,095,344, 5,313,421, 5,315,541, 5,343,063, 5,661,053 and 6,222,762.

The NAND array utilizes series strings of more than two memory cells, such as 16 or 32, connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, and 6,522,580.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. The cell is programmed by causing electrons from the cell channel to move into the dielectric, where they are trapped and stored in a limited region. Several specific cell structures and arrays employing dielectric storage elements and are described in U.S. Pat. No. 6,925,007.

As in most all integrated circuit applications, the pressure to shrink the silicon substrate area required to implement some integrated circuit function also exists with flash EEPROM memory cell arrays. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell and/or per storage unit or element. This is accomplished by dividing a window of a storage element charge level voltage range into more than two states. The use of four such states allows each cell to store two bits of data, eight states stores three bits of data per storage element, and so on. Multiple state flash EEPROM structures using floating gates and their operation are described in U.S. Pat. Nos. 5,043,940 and 5,172,338, for example, and aforementioned U.S. Pat. No. 6,925,007 describes structures using dielectric charge storage elements that may be operated in multiple states to store more than one bit of data in individual charge storage regions. Selected portions of a multi-state memory cell array may also be operated in two states (binary) for various reasons, in a manner described in U.S. Pat. Nos. 5,930,167 and 6,456,528.

Memory cells of a typical flash EEPROM array are divided into discrete blocks of cells that are erased together. That is, the block is the erase unit, a minimum number of cells that are simultaneously erasable. Each block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the block in which they are stored. Such memories are typically configured with 16, 32 or more pages within each block, and each page stores one or just a few host sectors of data.

In order to increase the degree of parallelism during programming user data into the memory array and read user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, physical blocks may be logically linked together to form virtual blocks or metablocks. That is, each metablock is defined to include one block from each plane. Use of the metablock is described in U.S. Pat. No. 6,763,424. The metablock is identified by a host logical block address as a destination for programming and reading data. Similarly, all blocks of a metablock are erased together. The controller in a memory system operated with such large blocks and/or metablocks performs a number of functions including the translation between logical block addresses (LBAs) received from a host, and physical block numbers (PBNs) within the memory cell array. Individual pages within the blocks are typically identified by offsets within the block address. Address translation often involves use of intermediate terms of a logical block number (LBN) and logical page.

Data stored in a metablock are often updated, the likelihood of updates as the data capacity of the metablock increases. Updated sectors of one logical metablock are normally written to another physical metablock. The unchanged sectors are usually also copied from the original to the new physical metablock, as part of the same programming operation, to consolidate the data. Alternatively, the unchanged data may remain in the original metablock until later consolidation with the updated data into a single metablock.

It is common to operate large block or metablock systems with some extra blocks maintained in an erased block pool. When one or more pages of data less than the capacity of a block are being updated, it is typical to write the updated pages to an erased block from the pool and then copy data of the unchanged pages from the original block to the erase pool block. Variations of this technique are described in aforementioned U.S. Pat. No. 6,763,424. Over time, as a result of host data files being re-written and updated, many blocks can end up with a relatively small number of its pages containing valid data and remaining pages containing data that is no longer current. In order to be able to efficiently use the data storage capacity of the array, logically related data pages of valid data are from time-to-time gathered together from fragments among multiple blocks and consolidated together into a fewer number of blocks. This process is commonly termed "garbage collection."

Individual flash EEPROM cells store an amount of charge in a charge storage element or unit that is representative of one or more bits of data. The charge level of a storage element controls the threshold voltage (commonly referenced as $V_T$) of its memory cell, which is used as a basis of reading the storage state of the cell. A threshold voltage window is commonly divided into a number of ranges, one for each of the two or more storage states of the memory cell. These ranges are separated by guardbands that include a nominal sensing level that allows determining the storage states of the individual cells. These storage levels do shift as a result of charge disturbing programming, reading or erasing operations performed in neighboring or other related memory cells, pages or blocks. For example, programming of one set of memory cells sharing a line or circuit with a second set of memory cells can disturb the charge levels of the second set. The end result of this parasitic disturb is that if no corrective action is taken on the part of the storage system controller, data in exposed areas not being operated on may be corrupted, and in an extreme case, beyond the corrective capabilities of any error correcting codes (ECCs) stored along with the data. Such data corruption would then result in loss of data to the user, thus rendering the storage system unreliable. The extent and nature of such disturbs in a particular memory cell array depends upon its specific architecture, structure and operation.

Therefore, it is beneficial to restore shifting charge levels back to the centers of their state ranges from time-to-time, before disturbing operations cause them to shift completely out of their defined ranges, in which case erroneous data are then read. Such a process, termed data refresh or scrub, is described in U.S. Pat. Nos. 5,532,962, 5,909,449 and 7,012,835. As a further aspect of this, in memory systems that use error correction codes (ECCs), some number of erroneous data bits read from the memory may be corrected by use of the ECC and the corrected data is then re-written to a previously erased portion of the memory. Re-writing the data causes each of the written memory cell threshold levels to be within its designated state range since data programming usually involves alternately adjusting the stored charge and read-verifying the resulting memory cell threshold level until it reaches the desired range that represents the data being stored in the cell.

SUMMARY OF THE INVENTION

The techniques described herein are principally directed to a situation where fewer than all the memory cells of a group of cells are read in response to a command, either from outside or from inside the memory system, and performing this read has a potential of disturbing the data stored in the group because of the physical structure of the memory system. The data stored in memory cells of the group that have not been read are primarily subject to such disturbs but data stored in memory cells that are read early in response to the command may in some cases be disturbed by later data reads of other memory cells.

The group of memory cells is typically but not necessarily a block of a large number of memory cells that are concurrently erasable prior to writing data into any memory cells of the group. The block is typically but not necessarily divided into a plurality of pages of memory cells, a page being the minimum unit for programming and reading data. One or more sectors of data are typically stored in each memory page. An ECC calculated from the data of a sector is usually stored along with the data of that sector. Commanded data reads normally include a check of the quality of the data read by use of the stored ECC. But when less than all the pages of a block are read, the effect of resulting disturbs on remaining pages not read is unknown. Also, the quality of a page of data read early in executing the command may be disturbed by reading subsequent pages, so an ECC check on the data read early may not provide an accurate indication of the quality of that data after the commanded partial block read is completed. Therefore, subsequent scrub reads of such data are often desirable.

In response to data being read from less than all of a group of memory cells by a host or otherwise, such as fewer than all the pages of a block, a scrub read is performed on a small proportion of the memory cells in the block, such as one or a small number of sectors, and the quality of the scrub read data is checked by use of the ECCs stored with the sectors of data.

The scrub read most commonly, but not always, reads data stored in one or more pages that were not read in response to the command. If there are an excessive number of errors in the scrub read data, then the entire block is refreshed. A refresh operation involves reading all the data from the block, correcting the errors in the data by use of the ECCs, and then rewriting the corrected data into another block that has been erased. This process is desirably performed often enough to avoid the stored data being disturbed to the extent that they are no longer correctable by use of the ECCs, but not so often that performance of the memory system is excessively degraded. By limiting the scrub read to a small amount of the storage capacity of a block, such as just one or a few sectors or one or two pages, the overhead added to the memory operation by the scrub process is minimized. The scrub read and any resulting refresh are preferably performed in the background, when the memory system is not otherwise responding to commands to read or write data therein.

The scrub read preferably reads data stored in a page or pages of the block that are more vulnerable to having their data disturbed by the particular partial block command read than other pages of the block. It is preferred to identify a single most vulnerable sector or page, whenever that is possible, and then scrub read the data from it. Either way, a worse case picture of the quality of the data in the block is obtained with only a small amount of data needed to be scrub read. The impact on the performance of the memory system by such scrub reads is therefore minimized.

Objective criteria may be established to identify the portion of the group or block of memory cells, such as a page, that is more vulnerable to being disturbed by the command read than other portions of the group. At least some of the criteria are dependent upon the structure of the memory array. For example, in a NAND array, it is recognized that the pages formed by word lines at either end of the strings of series connected memory cells are more susceptible to disturbs from programming in other pages of the block than are the remaining pages in between. This is because the memory cells at the ends of the strings behave differently than those located away from the ends. If data in one or both of these pages has not been read in response to the command, it is likely that the data in the unread one of these pages have been disturbed to an extent that is greater than in other unread pages. A scrub read is then performed on the unread one or both of these more vulnerable pages.

Another of the criteria for selecting the more vulnerable page(s) may be established to be dependent upon which pages of the block have been read in response to the command and in what order. For instance, in the above example, even if one or both of the extreme pages of the block has been read in response to the command, one of these pages is desirably scrub read if it was read early in the execution of the command and therefore subject to thereafter being disturbed by the subsequent reading of other pages of the block. In such a case, the ECC check performed as part of the normal command read may no longer represent the quality of the data in that page because of potential disturbs that could have resulted from reading subsequent pages. If one or both of these extreme pages are read in response to the command at or toward the end of the commanded data read process, however, the ECC bit error checking that occurs as part of a normal data read provides information of the quality of the data in those page(s) so that another scrub read of the same page(s) need not take place.

A further possible one of the criteria for identifying a more vulnerable page is to identify a page that has not been read in response to the command but which is physically located adjacent a page that was so read. Disturbs are more likely to occur on this page than other pages in the block, with the possible exception of the two pages at the extreme ends of NAND memory strings. This will depend upon the specific structure of the memory cell array.

Yet another of the established criteria can be the relative patterns of data stored in the pages of the block. For example, in the NAND memory array, disturbs of the charge levels of memory cells in states near or at their lowest stored charge levels is more likely than those with charge levels near or at their highest stored charge levels. This is because potentially disturbing voltages experienced by a memory cell with the lowest charge level are higher than those of a memory cell with the highest charge level. Therefore, a page with data represented by predominately low charge levels stored in its memory cells will be more vulnerable to disturbs than one with data represented primarily by higher stored charge levels. This is therefore another factor that may be used to select a more vulnerable page as a candidate for a scrub read.

There may be situations, as a result of applying the defined criteria for identifying the more or most vulnerable page in a particular partially read block, where no such page is identified. In this case, no scrub read takes place on that particular block. This means that it is unlikely that the quality of the data in any pages of the block is significantly less than that measured by use of the ECCs of the data read in response to the command. For example, as described above, if at least one of the extreme pages of a NAND string array is read near the end of the commanded read process, the ECCs obtained from this read provides a current indication of the quality of the data stored there. If the number of bit errors is zero or below some defined threshold, then it is known that the quality of the data in the page is acceptable, which may be taken to be an indication of the worst quality of data stored in the block. A scrub read on some other page is then unnecessary. On the other hand, if the number of bit errors is at or above the defined threshold, a refresh of all the data in the block is indicated, also without having to do a separate scrub read.

Additional aspects, advantages and features of the present invention are included in the following description of exemplary examples thereof, which description should be taken in conjunction with the accompanying drawings.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

DESCRIPTION OF EXEMPLARY EMBODIMENTS

Memory Architectures and Their Operation

Figure 1A:
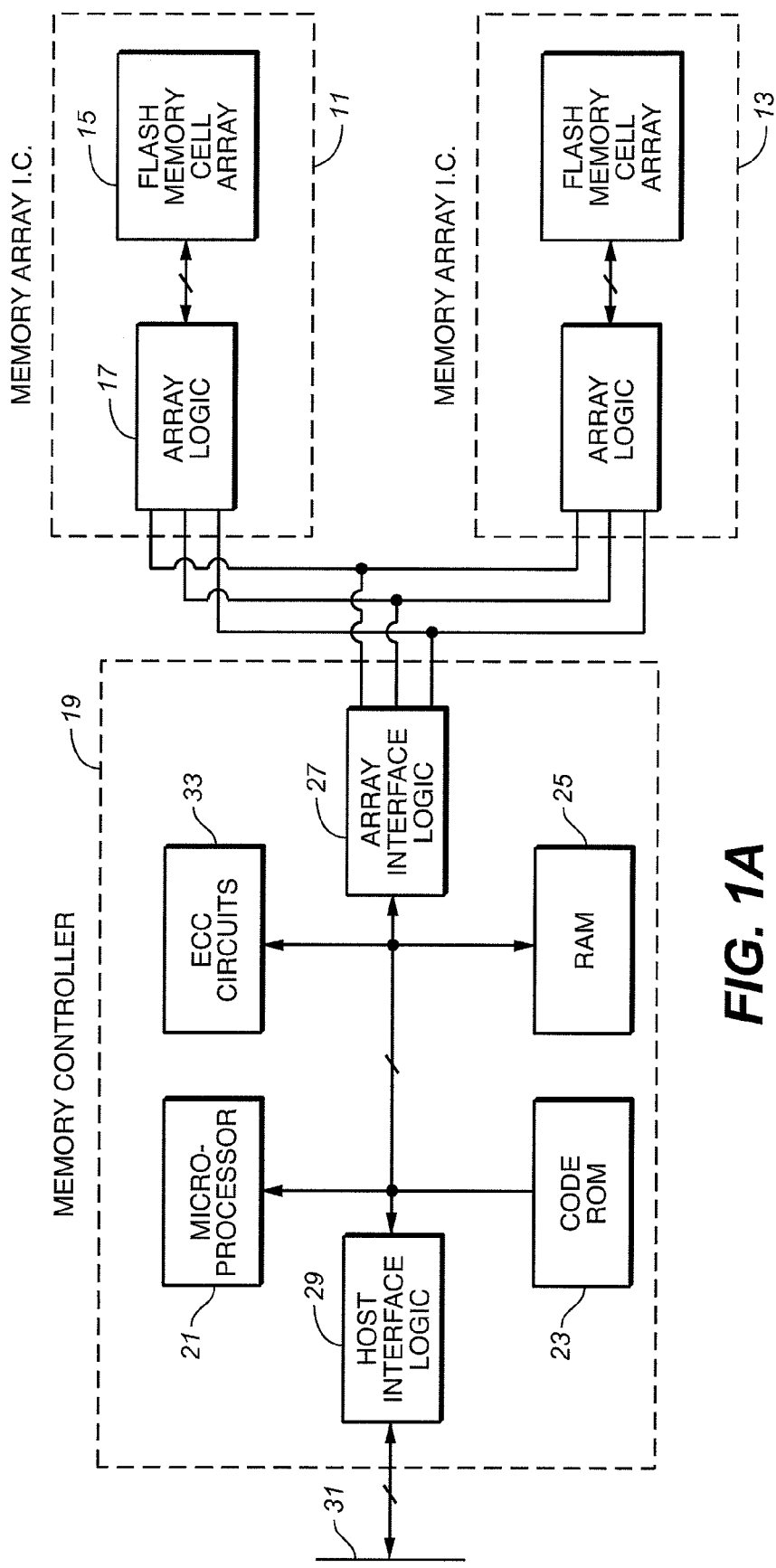
FIGS. 1A and 1B are block diagrams of a non-volatile memory and a host system, respectively, that operate together.

Referring initially to FIG. 1A, a flash memory includes a memory cell array and a controller. In the example shown, two integrated circuit devices (chips) 11 and 13 include an array 15 of memory cells and various logic circuits 17. The logic circuits 17 interface with a controller 19 on a separate chip through data, command and status circuits, and also provide addressing, data transfer and sensing, and other support to the array 13. A number of memory array chips can be from one to many, depending upon the storage capacity provided. The controller and part or the entire array can alternatively be combined onto a single integrated circuit chip but this is currently not an economical alternative.

A typical controller 19 includes a microprocessor 21, a read-only-memory (ROM) 23 primarily to store firmware and a buffer memory (RAM) 25 primarily for the temporary storage of user data either being written to or read from the memory chips 11 and 13. Circuits 27 interface with the memory array chip(s) and circuits 29 interface with a host though connections 31. The integrity of data is in this example determined by calculating an ECC with circuits 33 dedicated to calculating the code. As user data is being transferred from the host to the flash memory array for storage, the circuit calculates an ECC from the data and the code is stored in the memory. When that user data are later read from the memory, they are again passed through the circuit 33 which calculates the ECC by the same algorithm and compares that code with the one calculated and stored with the data. If they compare, the integrity of the data is confirmed. If they differ, depending upon the specific ECC algorithm utilized, those bits in error, up to a number supported by the algorithm, can be identified and corrected. Typically, an ECC algorithm is used that can correct up to 8 bits in a 512 byte sector.

Figure 1B:
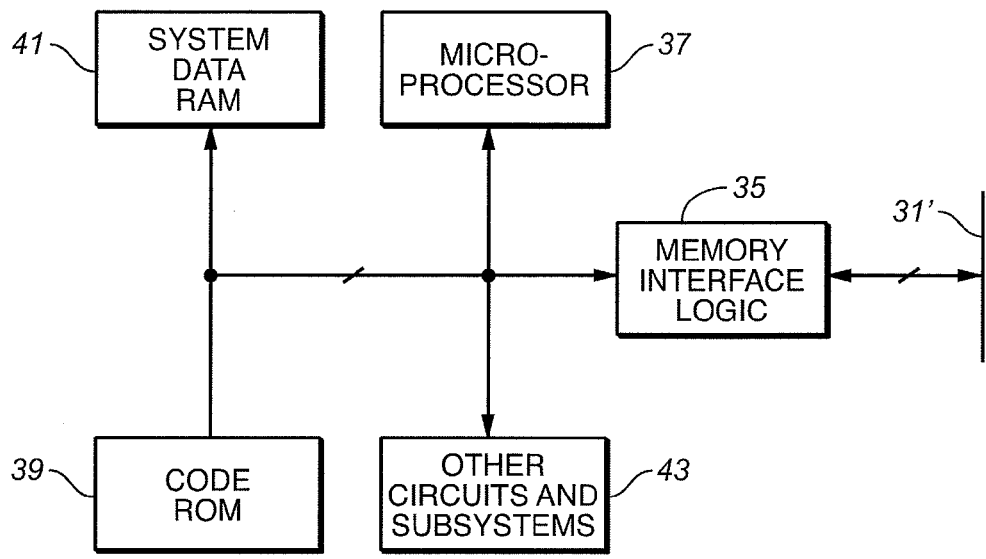

The connections 31 memory of FIG. 1A mate with connections 31' of a host system, an example of which is given in FIG. 1B. Data transfers between the host and the memory of FIG. 1A through interface circuits 35. A typical host also includes a microprocessor 37, a ROM 39 for storing firmware code and RAM 41. Other circuits and subsystems 43 often include a high capacity magnetic data storage disk drive, interface circuits for a keyboard, a monitor and the like, depending upon the particular host system. Some examples of such hosts include desktop computers, laptop computers, handheld computers, palmtop computers, personal digital assistants (PDAs), MP3 and other audio players, digital cameras, video cameras, electronic game machines, wireless and wired telephony devices, answering machines, voice recorders, network routers and others.

The memory of FIG. 1A may be implemented as a small enclosed card containing the controller and all its memory array circuit devices in a form that is removably connectable with the host of FIG. 1B. That is, mating connections 31 and 31' allow a card to be disconnected and moved to another host, or replaced by connecting another card to the host. Alternatively, the memory array devices may be enclosed in a separate card that is electrically and mechanically connectable with a card containing the controller and connections 31. As a further alternative, the memory of FIG. 1A may be embedded within the host of FIG. 1B, wherein the connections 31 and 31' are permanently made. In this case, the memory is usually contained within an enclosure of the host along with other components.

Certain terms used in this description can benefit from some explanation. A "sector" refers to independently addressable units of data accessed during host read and write operations. One sector of data is typically 512 bytes in size.

The "memory system" as used herein is a system consisting of one or more non-volatile memory devices and the hardware and/or software required to store and retrieve data to and from the memory. Varying portions of the overall memory system may be implemented functionally either on a subsystem completely dedicated to data storage, or on the host system itself. The memory system may be embedded in a host system or may be removable, such as in the form of a very small card. Portions of a removable memory system may themselves be removable, as for example if the storage media portion is removable from the controller portion. Any portion of a host system dedicated specifically to data storage in a memory system is also considered a part of the memory system. Such host functionality may include specialized software libraries, drivers, or applications in addition to any hardware residing on the host system.

For the purposes used herein, a "host system" is a system that generally has a functionality other than data storage, but which also either removably connects to the memory system, or has the memory system embedded in it. There can be host systems whose sole purpose is data storage.

Figure 2:
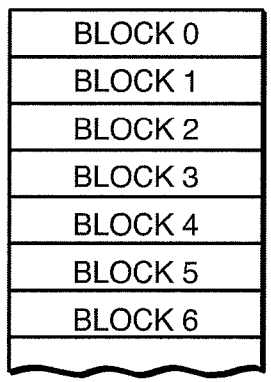
FIG. 2 illustrates a first example organization of the memory array of FIG. 1A.

The various techniques for refreshing and scrubbing data stored in flash memory described herein may be implemented in systems having various specific configurations, examples of which are given in FIGS. 2-6. FIG. 2 illustrates a portion of a memory array wherein memory cells are grouped into blocks, the cells in each block being erasable together as parts of a single erase operation, usually simultaneously. The physical block is the minimum unit of erase.

Figure 3:
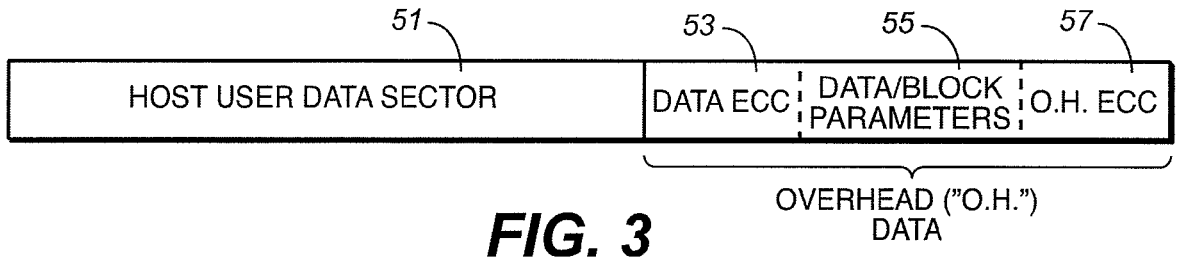
FIG. 3 shows an example host data sector with overhead data as stored in the memory array of FIG. 1A.

The size of the individual memory cell blocks of FIG. 2 can vary but one commercially practiced form includes a single sector of data in an individual block. The contents of such a data sector is illustrated in FIG. 3. User data 51 are typically 512 bytes of data. In addition to the user data 51 are overhead data that includes an ECC 53 calculated from the user data, parameters 55 relating to the sector data and/or the block in which the sector is programmed and an ECC 57 calculated from the parameters 55 and any other overhead data that might be included. The parameters 55 may include a quantity related to the number of program/erase cycles experienced by the block ("hot counts"), this quantity being updated after each cycle or a preset number of cycles. One use of this experience quantity is to regularly re-map logical block addresses to different physical block addresses in order to even the usage (wear leveling) of all the blocks. Another use of the experience quantity is to change voltages and other parameters of programming, reading and/or erasing as a function of the number of cycles experienced by different sectors.

The parameters 55 may also include an indication of the bit values assigned to each of the storage states of the memory cells, commonly referred to as their "rotation". That is, logical states of the data are mapped to different physical storage states. This also has a beneficial effect in wear leveling. One or more flags may also be included in the parameters 55 that indicate status or states. Indications of voltage levels to be used for programming and/or erasing the block can also be stored within the parameters 55, these voltages being updated as the number of cycles experienced by the block and other factors change. Other examples of the overhead parameters 55 include an identification of any defective cells within the block, the logical address of the data block that is mapped into this physical block and the address of any substitute physical block in case the primary block is defective. The particular combination of parameters 55 that are used in any memory system will vary in accordance with the design. Also, some or all of the overhead data can be stored in physical blocks dedicated to such a function, rather than in the block containing the user data or to which the overhead data relates.

Figure 4:
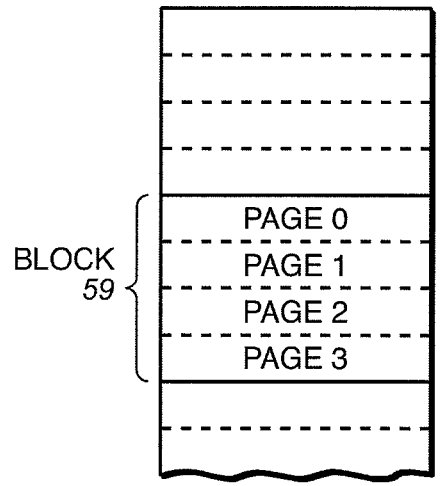
FIG. 4 illustrates a second example organization of the memory array of FIG. 1A.

Different from the single data sector block of FIG. 2 is a multi-sector physical block of FIG. 4. An example block 59, still the minimum unit of erase, contains four pages 0-3, each of which is the minimum unit of programming. One or more host sectors of data are stored in each page, usually along with overhead data including at least the ECC calculated from the sector's data and may be in the form of the data sector of FIG. 3. When data of less than all the pages are updated, the updated data are typically stored in a page of an erased block from an erased block pool and data in the remaining unchanged pages are copied from the original block into the new block. The original block is then erased. Variations of this large block management technique include writing the updated data into a page of another block without moving data from the original block or erasing it. This results in multiple pages having the same logical address. The most recent page of data is identified by some convenient technique such as the time of programming that is recorded as a field in sector or page overhead data.

Figure 5:
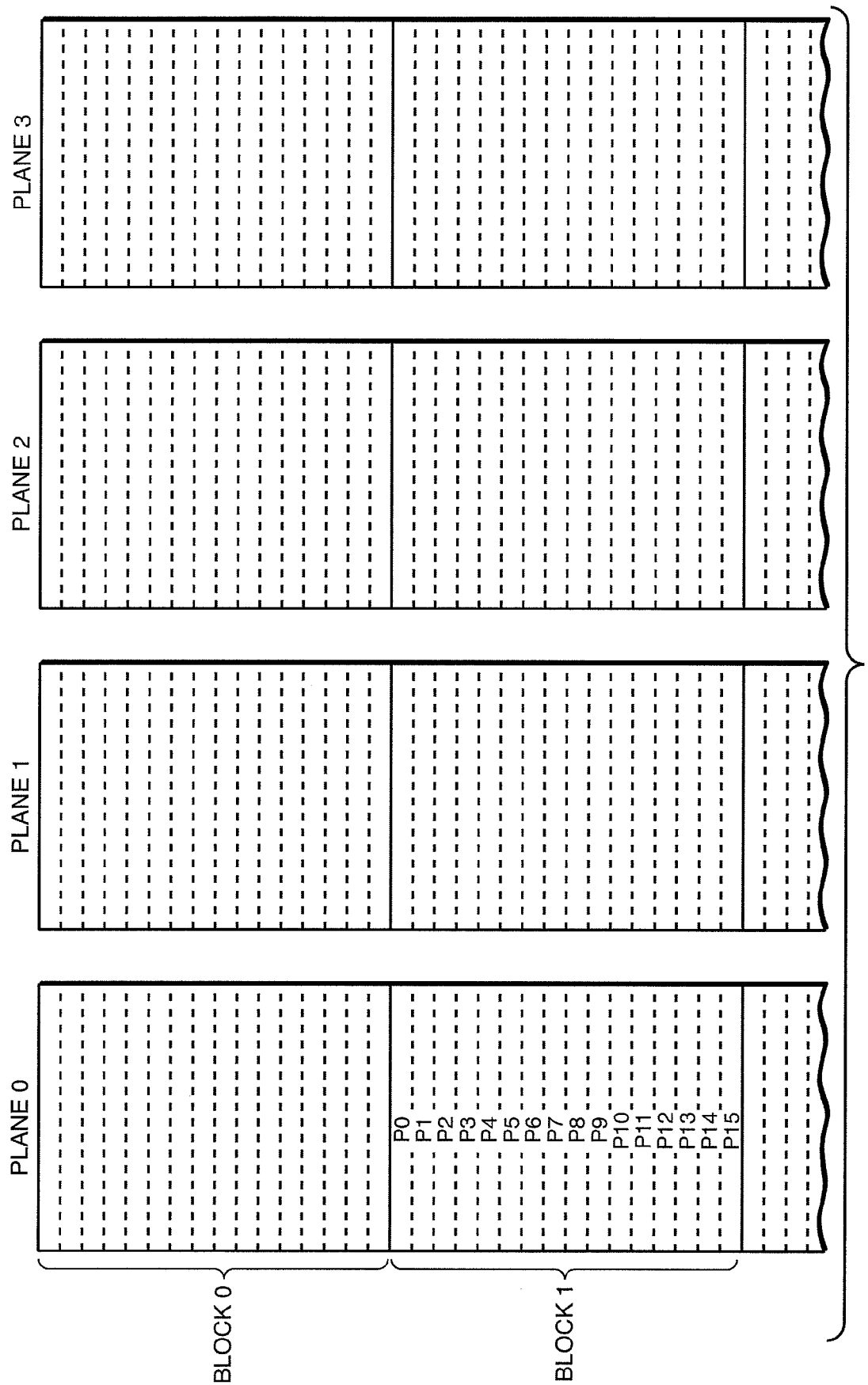
FIG. 5 illustrates a third example organization of the memory array of FIG. 1A.

A further multi-sector physical block arrangement is illustrated in FIG. 5. Here, the total memory cell array is physically divided into two or more planes, four planes 0-3 being illustrated. Each plane is a sub-array of memory cells that has its own data registers, sense amplifiers, addressing decoders and the like in order to be able to operate largely independently of the other planes. All the planes may be provided on a single integrated circuit device or on multiple devices, an example being to form each plane from one or more distinct integrated circuit devices. Each block in the example system of FIG. 5 contains 16 pages P0-P15, each page having a capacity of one, two or more host data sectors and some overhead data.

Figure 6:
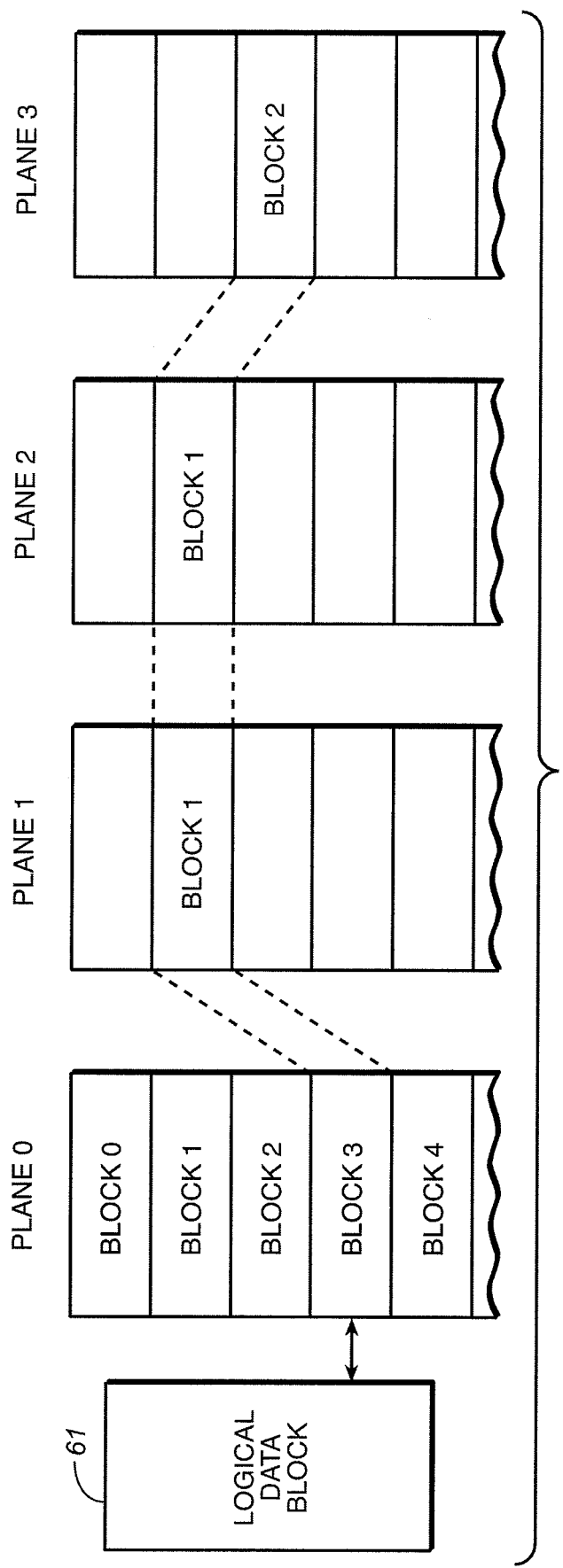
FIG. 6 shows an extension of the third example organization of the memory array of FIG. 1A.

Yet another memory cell arrangement is illustrated in FIG. 6. Each physical plane contains a large number of blocks of cells. In order to increase the degree of parallelism of operation, blocks within different planes are logically linked to form metablocks. One such metablock is illustrated in FIG. 6 as being formed of block 3 of plane 0, block 1 of plane 1, block 1 of plane 2 and block 2 of plane 3. Each metablock is logically addressable and the memory controller assigns and keeps track of the blocks that form the individual metablocks. The host system preferably interfaces with the memory system in units of data equal to the capacity of the individual metablocks. Such a logical data block 61 of FIG. 6, for example, is identified by a logical block addresses (LBAs) that are mapped by the controller into the physical block numbers (PBNs) of the blocks that make up the metablock. All blocks of the metablock are erased together, and individual pages from each physical block within a logical metablock are preferably programmed and read simultaneously.

Figure 7:
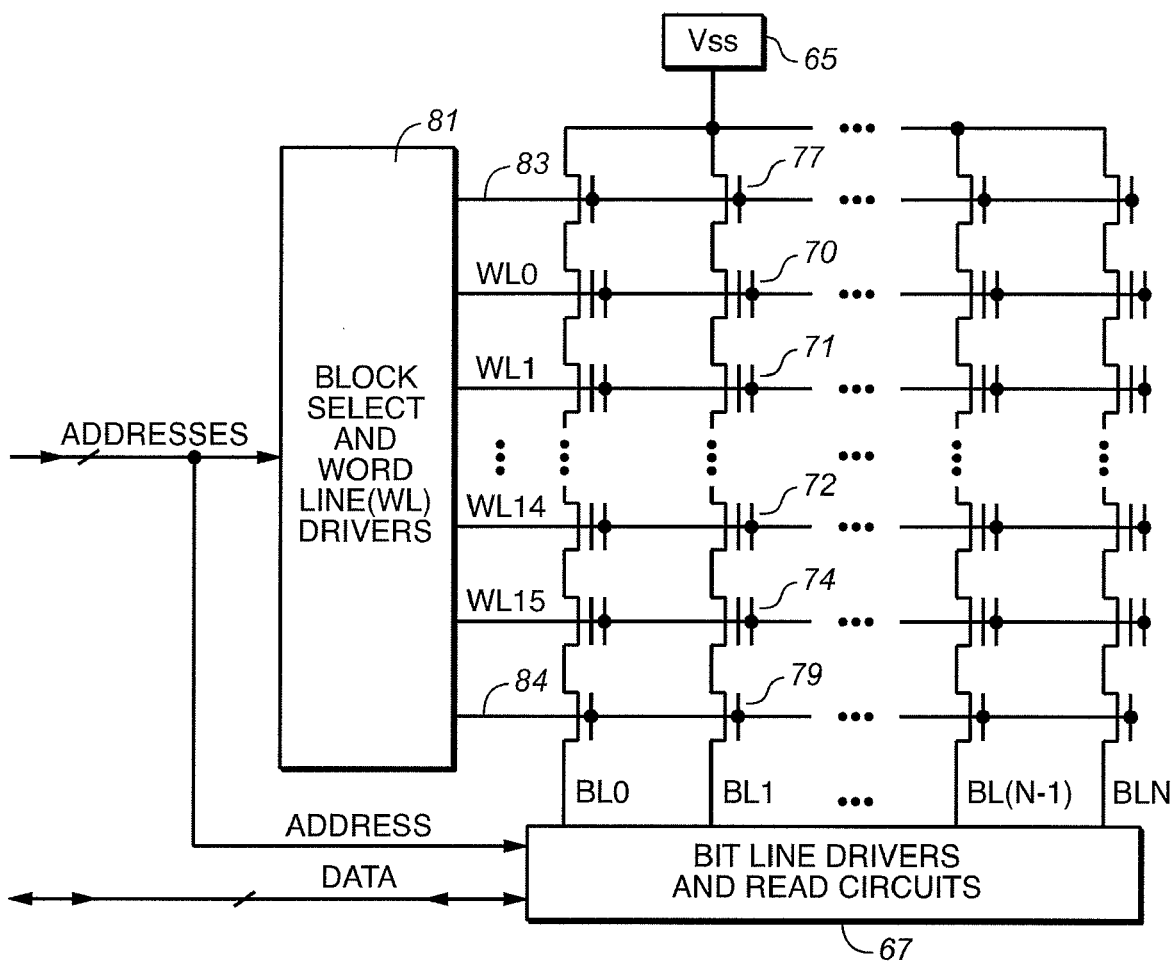
FIG. 7 is a circuit diagram of a group of memory cells of the array of FIG. 1A with one particular configuration.

There are many different memory array architectures, configurations and specific cell structures that may be employed to implement the memories described above with respect to FIGS. 2-6. One block of a memory array of the NAND type is shown in FIG. 7. A large number of column oriented strings of series connected memory cells are connected between a common source 65 of a voltage $V_{SS}$ and one of bit lines BL0-BLN that are in turn connected with circuits 67 containing address decoders, drivers, read sense amplifiers and the like. Specifically, one such string contains charge storage transistors 70, 71 . . 72 and 74 connected in series between select transistors 77 and 79 at opposite ends of the string. In this example, each string contains 16 storage transistors but other numbers are possible. Word lines WL0-WL15 individually extend across one storage transistor of each string and are connected to circuits 81 that contain address decoders and voltage source drivers of the word lines. Voltages on lines 83 and 84 control connection of all the strings in the block together to either the voltage source 65 and/or the bit lines BL0-BLN through their select transistors. Data and addresses come from the memory controller.

Each row of charge storage transistors (memory cells) of the block forms a page that is programmed and read together. An appropriate voltage is applied to the word line (WL) of such a page for programming or reading its data while voltages applied to the remaining word lines are selected to render their respective storage transistors conductive. In the course of programming or reading one row (page) of storage transistors, previously stored charge levels on unselected rows can be disturbed because of voltages applied across all the strings and to their word lines.

Figure 8:
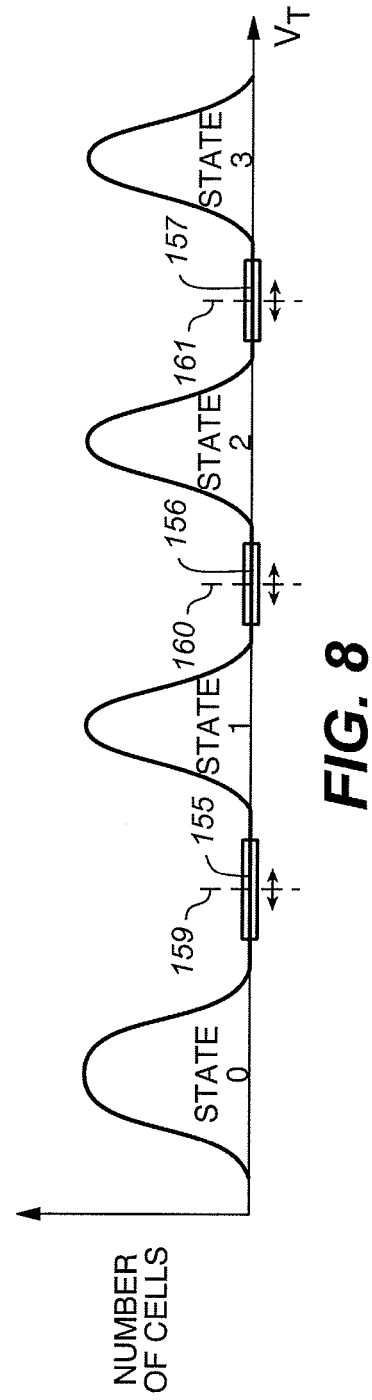
FIG. 8 shows curves of example distributions of voltage threshold levels of a group of programmed memory cells.

An example of operating the individual storage elements in a flash memory array in four states is illustrated in FIG. 8. A distribution of a number of storage elements within a unit of memory cells, such as a sector or page, within each of four threshold voltages ($V_T$) level ranges is shown. Threshold voltage guard bands 155, 156 and 157 are maintained between the storage state threshold level ranges with an absence of data from any cells therein. This is the desired programmed condition that exists immediately after programming and verifying the states of a unit of cells. But as other units are then programmed, read and/or erased, this data can be disturbed. Disturbs are exhibited by the threshold levels shifting to one side or the other into the adjacent guard bands. This can occur for a small proportion of the cells within each state distribution or the entire distribution can shift or spread into adjacent guard bands, depending upon the nature of the disturbs.

For a normal read, breakpoint levels 159, 160 and 161 in about the middle of the respective guard bands 155, 156 and 157 are used. That is, the threshold levels of the cells being read are compared with these breakpoint levels to determine their storage states. Errors occur when the threshold levels of cells within one state shift through a guard band across a breakpoint level. For example, when the threshold levels of cells in state 1 shift lower until they are below the breakpoint level 159, those cells are then read to be in state 0. Similarly, if the threshold levels of cells in state 1 shift higher until above the breakpoint level 160, a normal read will say that those cells are in state 2. Such read data errors are then identified by the ECC process.

But when there are too many such errors for the particular ECC algorithm being used to correct, a second read with different breakpoint levels between states may be made. The breakpoint levels 159, 160 and 161 are shifted within their respective guard bands in a direction of the expected shift of storage threshold levels from the disturbs, so that the shifted levels are now on the same side of the guard band as they were before being disturbed. If this still does not read data that can be corrected by the ECC, the scrub operation will usually be determined to have failed and the page or memory block in which the uncorrectable errors exist is marked as bad. The data that cannot be read is then lost. Since these data were verified as part of the original programming to initially be in their correct threshold level range, this effect of an accumulation of disturbing operations over time shows the desirability of scrubbing frequently enough to avoid such an adverse consequence.

It may also be desirable to further check and adjust the storage levels of cells from which even valid data are read. This involves re-reading the data with different break point levels than used in the initial read, in order to identify any cells where the stored charge has moved into a guard band between the levels defined for the various states (see FIG. 8), even though those levels have not crossed a breakpoint level to cause a normal read data error. The breakpoint levels used during this read, for example, are shifted to edges of the guard bands 155, 156 and 157 of FIG. 8. If it is then determined by use of the ECC that errors in the read data exist, the erroneous bits of data indicate the shifting of charge levels to cause memory cell threshold levels to move into the guard bands. So it may be desirable to correct and rewrite these data, so that the stored charge levels will be shifted out of the guard bands to within their intended state distributions of FIG. 8.

Data Scrub and Refresh, Generally

A particular scrub operation included in a flash memory system compensates for disturbs of storage levels in one group of memory cells that are caused by programming, reading or erasing operations performed on another group of memory cells on the same integrated circuit chip. The potential for such data disturbs increases as the memory cell arrays are shrunk in size. There is a tendency, in order to save space, for various signal lines to be shared among groups of memory cells such that one group experiences potentially repetitive exposure to voltages and/or currents during programming, reading or erasing the memory cells of another group. By scrubbing the data stored in all groups of memory cells in an organized and continuous manner, corruption of stored data over time is significantly reduced. Also, the storage of an increased number of bits per memory cell with an increased number of smaller voltage threshold state ranges is made practical when the disturbed charge levels are corrected by methodically restoring them to their intended levels.

A scrub operation entails reading data in areas that have received exposure to potentially disturbing signals, and performing some corrective action if this data is determined to have been disturbed. Disturbs may be detected, for example, by checking the integrity of the data, such as by reading the data and obtaining the results of an ECC check of the data. Corrective action may entail rewriting the data in the same location, or in a different location, and it can involve a higher-level defect or data management operation.

Scrub operations are preferably performed in the background, when the memory system is not reading or writing data. The memory system may look to the host to indicate when the host will not be asking the memory to store or retrieve data, during which time a scrub operation may be carried out.

Even if one or more data errors are detected in a particular scrub read, it might be determined not to take corrective action if the error(s) can be corrected by ECC upon reading the data, in order to maintain system performance. When user data and overhead data of the individual sectors have their own ECC, data errors in the overhead data are less likely to be allowed to go uncorrected than errors in the user data.

In memory systems utilizing large blocks or metablocks of memory cells that individually store a large number of host data sectors, a sector(s) of data of a first physical block that is corrected during a scrub operation may be re-written into a second block into which remaining data sectors of the first block are copied, consistent with the erase pooling method of memory management described above. Alternately, a block or metablock may be dedicated to the temporary storage of scrub corrected data sectors until other data sectors from the same blocks or metablocks as the corrected sector(s) need to be moved for some other reason, such as for garbage collection, at which time the scrub corrected data sectors may be recombined with other data sectors of the same block or metablock. This improves system performance.

Once it is determined that corrective action needs to be taken with certain specified data, that action may be deferred if taking the corrective action at that time may adversely affect system performance, and if the data can be read without the corrective action, if necessary, before the corrective action later takes place. All corrected data, addresses and various parameters as determined at the time of deferral are temporarily stored and later retrieved when a deferred corrective action is executed. In systems organized in large blocks or metablocks of memory cells, corrective scrub actions may be deferred until a given amount of data from a given block or metablock are scheduled for corrective action, in which case all the deferred data sectors of the given block or metablock are corrected at the same time. This can reduce the amount of data copying and re-writing that occurs when the data sectors of the given block or metablock are consolidated together again.

Figure 9A:
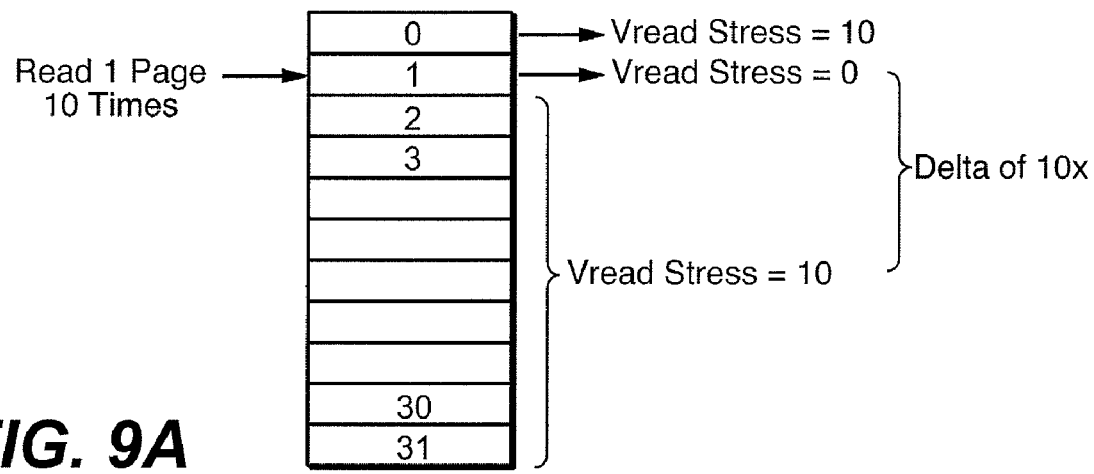
FIGS. 9A, 9B and 9C give three examples of different memory operational patterns within a single block that illustrate a possible need to refresh data stored in the block.
Figure 9B:
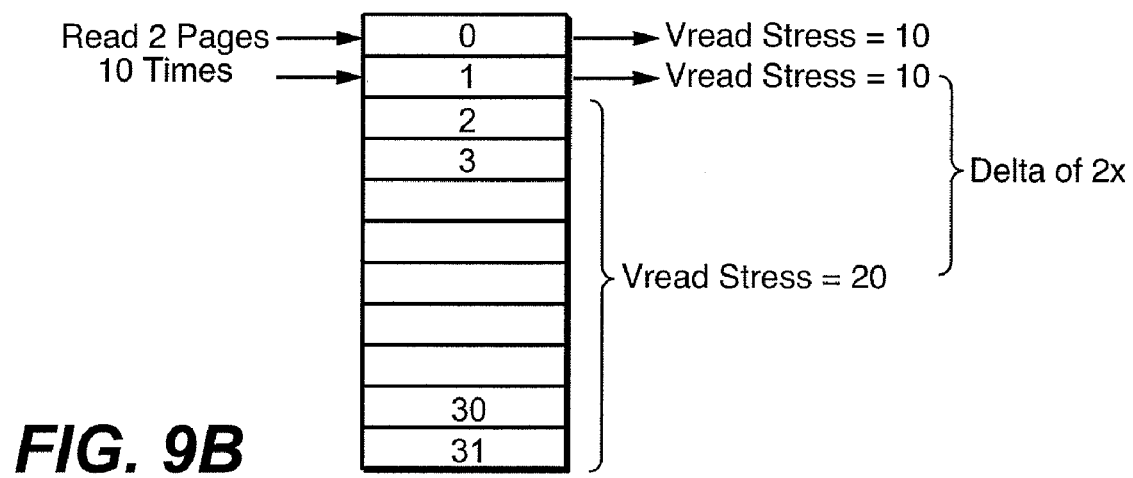
Figure 9C:
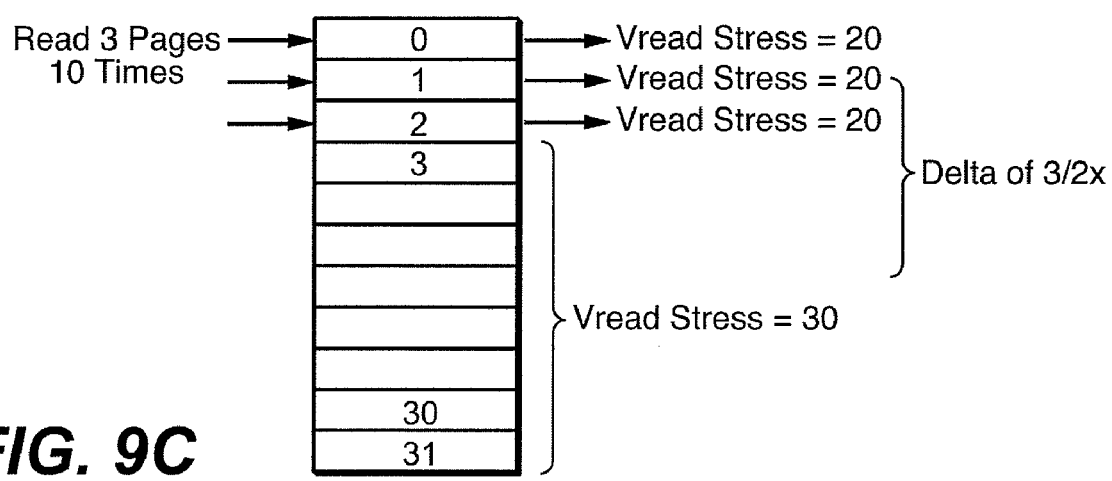

FIGS. 9A, 9B and 9C illustrate three examples of stresses to which individual pages of a block can be subjected when less than all pages of the block are read, particularly when only one or a very few pages are read multiple times while remaining pages of the block are not read. In these examples, the block contains thirty-two pages 0-31.

In the first example of FIG. 9A, page 1 has been read ten times during a period when none of the other pages of the block are read. The worst case scenario is when the system repeatedly performs a single page read, the situation illustrated by FIG. 9A. Stored charge levels in memory cells of the other pages in the same block are subjected to potentially disturbing voltages every time the single page is read. Shifts in the charge levels in these other pages, and thus shifts in the memory cell threshold levels, go undetected. Upon each of the multiple reads of the data from page 1 of FIG. 9A, the validity of that data is checked by use of its stored ECC. Any need to refresh the data stored in page 1 is thus discovered as a normal part of reading its data. But no such check is made on the data of the other pages 0 and 2-31. The charge levels in the memory cells of pages 0 and 2-31 may be changed in value (disturbed) by voltages applied to them as a consequence of reading page 1. Causes of such disturbs include voltages on bit lines that run through all the pages, voltages applied to the word lines of the non-selected pages 0 and 2-31 to render their memory cells conductive, and the like.

Each time page 1 of the FIG. 9A example is read, these voltages create a stress on the memory cells of the remaining pages in the block. This can be considered, for discussion purposes, to be a read stress of 1. Therefore, as indicated in FIG. 9A, ten reads of page 1 causes each of the other pages 0 and 2-31 of the block to be subjected to a stress of 10 during this period. The effect of this stress on the individual pages 0 and 2-31 depends upon the vulnerability of the pages to disturbs. As described elsewhere herein, the vulnerability of a particular one of the pages 0 and 2-31 depends upon many factors. One factor is its location within the block. End pages 0 and 31 are most vulnerable because of the higher voltages placed across them. This vulnerability is described in pending U.S. patent application Ser. Nos. 11/618,482 and 11/618,498, both filed Dec. 29, 2006, now publication nos. 2008/0158958 A1 and 2008/0158959 A1 Also, pages 0 and 2 have a higher degree of vulnerability than pages 3-31 because they are adjacent the page 1 that is being read multiple times. Another vulnerability factor is the pattern of data stored in the individual pages that are not read. Because the pages 0 and 2-31 may have different levels of vulnerability, the effect on them individually from exposure to the same level of read stress may not be the same.

In the example of FIG. 9B, data stored in pages 0 and 1 are read ten times each, during a period when the data in pages 2-31 are not read at all. This creates a stress level of 20 on each of the unread pages 2-31. Each of the read pages 0 and 1 have a stress level of 10, once for each time data of the other of the pages 0 and 1 are read.

Similarly, in the example of FIG. 9C, data are read from each of three pages 0-3 ten times while the remaining pages 3-31 of the block are not read at all. The read stress on each of the pages 3-31 is 30, once for each of the total number of thirty reads on pages 0-2. Each of the pages 0-2 is subjected to 20 units of stress, one for each of the reads of the other two pages.

Specific Read Scrub Process Examples

The purpose of FIGS. 9A-9C is to demonstrate the stress levels to which pages of a partially but repeatedly read block are subjected. These stress levels could be monitored and, when combined with the different vulnerabilities of the pages in the block, used to identify the page whose data are most likely to be disturbed after such multiple reads. This is the page of the block that is most likely to contain data errors. That page would then be scrub read in order to determine the quality of the data stored in it. If the quality of the data in such a page is good, then it follows that the quality of the data stored in the other pages of the block is even better. Only one page of the block therefore needs to be scrub read after some number of reads of less than all its pages. This is an efficient scrub process.

But that process requires keeping track of the number of reads of less than all the pages of each block in the system, and then making a determination of when the stress level of a page within an individual block, combined with its possibly unique level of vulnerability to disturbs, justifies scrub reading the data in that page. It is preferable in the specific scrub process examples described herein to avoid having to keep track of the number of reads of individual pages. Indeed, it is preferable that the scrub process not require keeping track of any historical operation data, thereby neither requiring the use of memory system resources for that purpose nor degrading the performance of the memory system.

Therefore, the scrub read of data in a very small proportion of the pages of a block, preferably a single page but typically no more than two pages, is considered after every partial read of the block and executed after most of them. That is, when memory system executes a command from the host or the memory system controller to read pages of one block, it is determined upon the host or controller commanding that data be read from some other block, or that some other operation be performed, that reading data from the first block has been completed. It is then determined whether fewer than all the pages of the block were read. If so, with some few exceptions, the data of one page is typically scrub read from that block.

Figure 10:
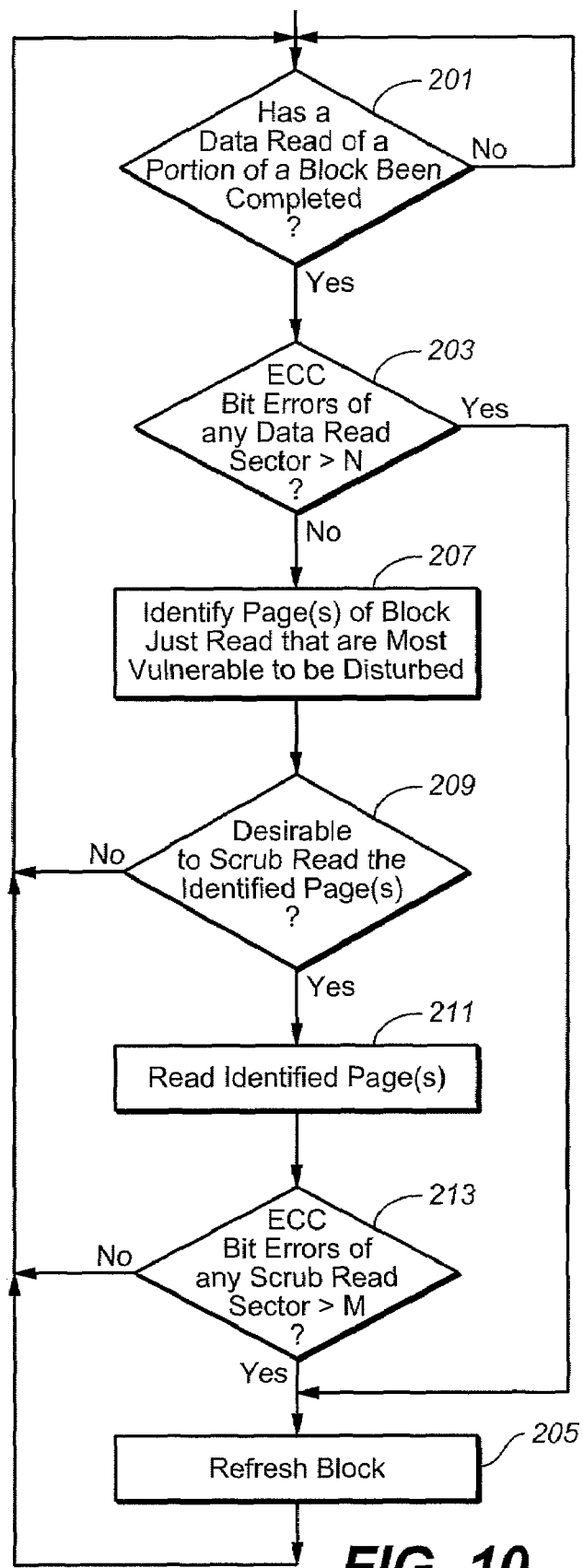
FIG. 10 is a flowchart that illustrates a first example of major steps in a memory scrub and refresh operation.

Referring to FIG. 10, a specific example scrub algorithm is illustrated in a flowchart form. In a first step 201, it is determined whether there has been a partial block read, in the manner described in the immediately preceding paragraph. As soon as reading data from another block is commanded, for example, it is known that reading of the first block has ended. If less than all the pages of that first block were read, it is known that a partial data read of that block has been completed.

A next step 203 considers whether any bit errors of the data read from the pages exceeds a predetermined threshold. A number of acceptable bit errors for a unit of read data is set, in this example a number N. This is a number of bit errors of a unit of data upon which ECC is calculated, a sector of data in this example, which can be tolerated. The number N can be 0, thus not tolerating any data errors but then requiring frequent data refresh operations. Alternately, if N is set to the maximum number of bits that the ECC algorithm being used can correct, such as 8 bits, only the existence of uncorrectable data will trigger refresh of the block. In the later case, the refresh operation will have to read the sector or other unit of data having more than the number of correctable bit errors with relaxed read thresholds, as discussed above. Therefore, some number N between these two extremes is selected for the threshold. For example, if the ECC algorithm can correct up to 8 bits, N may be selected to be one-half of that, or even higher at 5 or 6 bits. If the number of bit errors in any sector or other unit of command read data exceeds this threshold, the process proceeds immediately to a step 205, wherein data in the entire block is refreshed.

If it is determined in the step 203 that the number of any bit errors in the commanded data read is below the threshold, a single page, or, alternatively, a very small proportion of the number of pages of the block, are identified for a scrub read, in a step 207. This is the page(s) of the block that is determined to be most vulnerable to having its data disturbed as the result of the completed partial block command read. The various criteria that may be employed in the step 207 to identify the most vulnerable block(s) will now be described.

One criterion is the physical position of the pages within the block. In a NAND array, the first and last pages, such as pages 0 and 31 of FIGS. 9A-9C, are more likely than the pages in between, such as pages 1-30, to have their stored charge levels altered when other pages of the block are read. As discussed above, this is because, when reading data from a page of the block, higher voltages are applied across these extreme pages than across those pages in between. Therefore, when determining the most vulnerable page in the block, these two pages are considered.

Another criterion is the identity of the page(s) subjected to the command read, and the order in which they were read. For example, if data are read from one the first and last physical pages as the last page of the command read, the normal quality check of the read data by use of the ECC will be current and a scrub read of that page is unnecessary. However, if data are command read from one of these extreme pages, followed by a command read of other pages within the block, reading these other pages can disturb the data stored in the one extreme page. Its data quality indication determined by use of the ECC as part of the command read is no longer current. The earlier read extreme page of the block can therefore be vulnerable to being disturbed from the subsequent reading of the other page(s) of the block. This also points out that noting which page(s) of a subject block has been command read and which have not been so read is another criterion used to identify the most vulnerable page(s). The number of pages command read after reading a particular page may also be considered in determining whether the particular page is the most vulnerable of the pages in the block.

The number of bit errors in the data read from various pages in response to a command, as determined by the ECC in the ordinary course of reading the data, can also be a criterion that is used in some circumstances to identify the most vulnerable page(s). For example, the number of bit errors in data that have been command read from one of the extreme pages 0 or 31 of a block may be used to determine whether that page is a candidate for the most vulnerable page. This is the case when other pages are command read after the extreme page, and thus subject the data in the extreme page to the possibility of being disturbed. If the number of bit errors of the data command read from the extreme page is zero or low, then it can be concluded that the subsequent command reads of other pages in the block is unlikely to have disturbed the data in the extreme page to an extent that corrective action may be necessary. On the other hand, if the number of bit errors is relatively high, such as 4-6 with use of an ECC algorithm that can correct 8 bits, that extreme page may be a candidate for the most vulnerable page, depending upon the situation with other pages of the block.

Yet another criterion for identifying the most vulnerable page(s) of a block is the physical proximity of pages not read in response to the command and those that were read. For example, data stored in an unread page immediately adjacent a page that was command read are typically more likely to be disturbed than a page separated from a command read page by one or more unread pages.

A further criterion that may be included in making the determination of step 207 of FIG. 10 is the pattern of data stored in the pages of the block. In NAND arrays, for example, disturbs of charge levels stored in memory cells at or near the lowest level that represents a storage state are more vulnerable to being disturbed than higher levels of charge being stored. So the number of charge storage elements or memory cells of a given page having the lowest charge level state stored therein versus the number that are storing higher charge levels, particularly the number storing the highest, is a criterion that may be used to determine the most vulnerable page(s) of the block.

The step 207 of FIG. 10 may be carried out by considering only one of the criteria discussed above, such as whether a page is one of the extreme pages. Alternatively, all or some number less than all of these criteria may be used together by assigning relative levels of importance to each.

Once the most vulnerable page(s) of the block is identified, a next step 209 determines whether the identified page(s) should be scrub read. A scrub read will take place in most all cases, after a partial command read of a block. But there are circumstances where a scrub read need not take place. If the page identified to be the most vulnerable was read at or toward the end of the command read, for example, it will not be scrub read. This is because the quality of its data has already been determined in the step 203 to be good, and nothing has occurred that will is likely to caused that data to be disturbed. If the data is determined in the step 203 to be of low quality, of course, the steps 207 and 209 do not occur, since the block is then refreshed by the step 205.

A next step 211 is to scrub read the page(s) identified in the step 207 to have a high vulnerability to disturbs relative to other pages, or even identified to be the most vulnerable of all the pages in the block. The number of bit errors of the scrub read data are determined in the next step 213. That number is, in the embodiment of FIG. 10, compared with a preset number M. This number M may be the same as the threshold number N used with command read data in the step 203, or different. The level of confidence that the most vulnerable page has been identified in the step 207 will typically determine whether M is set to be near the upper end of the number of bits that the ECC can correct, if the confidence level is high, or whether it is best more conservatively set to a lower number.

Regardless of the specific number M, if any one sector, or other unit of data upon which the ECC is based, within the scrub read page(s) has a number of bit errors in excess of M, the process proceeds to step 205 to refresh the entire block in which the scrub read page(s) is located. But if the number of bit errors determined by the ECC in the scrub read data is higher than M, the block in which the subject pages reside is refreshed, in the step 205. This typically includes reading all the pages of data in the block, correcting the read data by use of the ECC, and then rewriting the corrected data into an erased block of the system erased block pool. The first block is then erased and placed into the pool. If any of the read pages cannot be corrected by use of the ECC with normal read reference levels, as part of the refresh operation, these levels can be changed and the data reread with the different reference levels in order to reduce the number of bit errors. This data may then be corrected by the ECC, if necessary.

Figure 11:
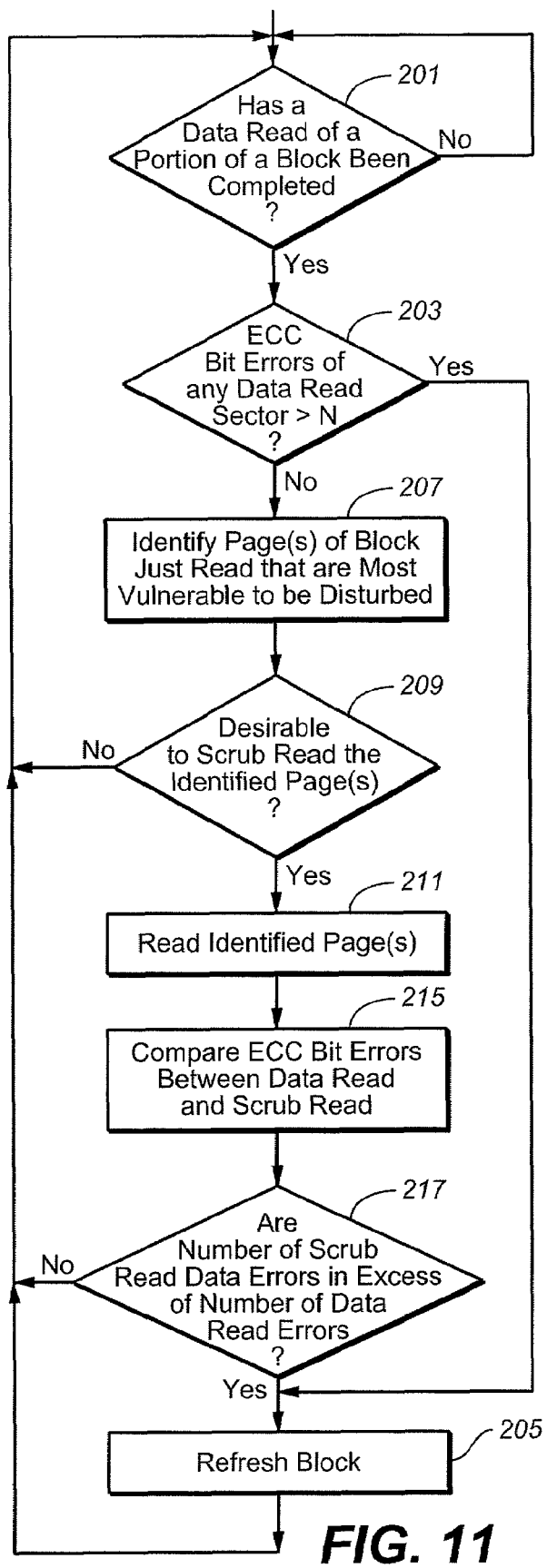
FIG. 11 is a flowchart that illustrates a second example of major steps in a memory scrub and refresh operation.

The flowchart of FIG. 11 illustrates an alternative algorithm to that of FIG. 10. But most of the steps are the same, so these are given the same reference numbers. What is different is the way in which it is determined from the number of bit errors in the scrub read data whether the block needs to be refreshed. The step 213 of the algorithm of FIG. 10 is replaced in the flow chart of FIG. 11 with steps 215 and 217. Instead of comparing the number of scrub read bit errors with a fixed threshold M, the method of FIG. 11 compares the number of scrub read bit errors with the number of bit errors determined in the step 203 to exist in the data that was command read from the same block.

In the step 215, the number of scrub read data bit errors are compared with the number of command read data bit errors. In the next step 217, it is determined whether the number of scrub read errors is in excess of the number of command read errors. If so, the block in which both the command read and scrub read have taken place is refreshed, in the step 205. But if the number of scrub read errors is equal to or less than the number of command read errors, it is determined that no refresh of the block is necessary.

There are typically multiple bit error quantities that result from each of these data reads since multiple sectors or other units of data upon which the ECCs are calculated are typically read together. The comparison is therefore preferably made between the maximum number of bit errors resulting from each of the command and scrub reads.

As an alternative to such a comparison of magnitudes of bit errors, a ratio may be taken of the command read and scrub read bit error numbers, preferably the maximum number of errors determined from their ECCs to exist in each read. This ratio is then compared with a predefined number. If that number is set to one, refresh of the block will occur when a ratio of the number of scrub read bit errors to the number of command read bit errors is greater than one.

CONCLUSION

Although the various aspects of the present invention have been described with respect to exemplary embodiments thereof, it will be understood that the present invention is entitled to protection within the full scope of the appended claims.

It is claimed:

1. A reprogrammable non-volatile memory system, comprising:
   a plurality of charge storage memory cells connected in a plurality of strings that individually contain a plurality of series connected memory cells, the strings being individually connectable at first and second ends thereof to respective first and second voltage sources and having word lines extending in a direction across the plurality of strings to individually define pages of memory cells, and
   a controller connected with the charge storage memory cells and that operates to:
      designate at least those pages of memory cells immediately adjacent the first and second ends of the strings to be vulnerable to being disturbed during execution of a commanded data read from pages of memory cells not immediately adjacent the ends of the strings,
      recognize when pages of memory cells not immediately adjacent the ends of the strings have been accessed and data stored in the accessed pages of memory cells read in response to a command,
      subsequently initiate a scrub read of data from at least some of the pages of memory cells immediately adjacent the first and second ends of the strings,
      determine a level of quality of the scrub read data and whether it is adequate, and
      if the level of quality of the read data is determined not to be adequate, refresh the data stored in the at least some of the pages of memory cells immediately adjacent the first and second ends of the strings.

2. The memory system of claim 1, wherein the plurality of strings are formed in groups of memory cells that individually contain a plurality of the pages of memory cells, the memory cells of individual groups being erasable concurrently.

3. The memory system of claim 1, wherein the controller further operates to:
   determine the level of quality of the read data by determining a number of bit errors in the scrub read data, and
   determine the level of quality of the scrub data by comparing the number of bit errors with a preset threshold.

4. The memory system of claim 1, wherein the controller further operates to:
   determine a level of quality of the scrub read data by determining a first number of bit errors in at least some of the command read data and a second number of bit errors in at least some of the scrub read data, and
   determine the level of quality of the scrub read data by comparing the first and second numbers of bit errors.

5. The memory system of claim 4, wherein the controller further operates to:
   compare the first and second numbers of bit errors by calculating a ratio of the first and second numbers, and thereafter comparing the ratio with a pre-defined threshold.

6. A reprogrammable non-volatile memory system, comprising:
   a plurality of groups of charge storage memory cells connected in a manner that accessing less than all of the memory cells in the group can disturb the levels of charge stored in other memory cells in the group, and
   a controller connected with the charge storage memory cells and that operates to:
      recognize when less than all the memory cells of the group have been accessed and the data stored therein have been read in response to a command,
      determine whether some of the memory cells within the group have a higher degree of vulnerability to being disturbed by the commanded data read than other memory cells of the group, and, if so, identify the memory cells within the group that have the higher degree of vulnerability to being disturbed by considering the number of memory cells of the group accessed in response to the command and a sequence in which the memory cells of the group are accessed,
      subsequently initiate a scrub read of data from at least some of the memory cells that have been identified to have the higher degree of vulnerability,
      determine a level of Quality of the scrub read data and whether it is adequate, and
      if the level of quality of the read data is determined not to be adequate, refresh the data stored in the memory cells of the group.

7. A reprogrammable non-volatile memory system, comprising:
   a plurality of groups of charge storage memory cells connected in a manner that accessing less than all of the memory cells in the group can disturb the levels of charge stored in other memory cells in the group, and
   a controller connected with the charge storage memory cells and that, operates to:
      recognize when less than all the memory cells of the group have been accessed and the data stored therein have been read in response to a command,
      determine whether some of the memory cells within the group have a higher degree of vulnerability to being disturbed by the commanded data read than other memory cells of the group, and, if so, identify the memory cells within the group that have the higher degree of vulnerability to being disturbed by considering physical characteristics of the memory cells in different physical locations within the groups,
      subsequently initiate a scrub read of data from at least some of the memory cells that have been identified to have the higher degree of vulnerability,
      determine a level of quality of the scrub read data and whether it is adequate, and
      if the level of quality of the read data is determined not to be adequate, refresh the data stored in the memory cells of the group.

8. A reprogrammable non-volatile memory system, comprising:
   a plurality of groups of charge storage memory cells connected in a manner that accessing less than all of the memory cells in the group can disturb the levels of charge stored in other memory cells in the group, and
   a controller connected with the charge storage memory cells and that operates to:
      recognize when less than all the memory cells of the group have been accessed and the data stored therein have been read in response to a command,
      determine whether some of the memory cells within the group have a higher degree of vulnerability to being disturbed by the commanded data read than other memory cells of the group, and, if so, identify the memory cells within the group that have the higher degree of vulnerability to being disturbed by considering patterns of data stored in the memory cells of the group,
      subsequently initiate a scrub read of data from at least some of the memory cells that have been identified to have the higher degree of vulnerability,
      determine a level of quality of the scrub read data and whether it is adequate, and if the level of quality of the read data is determined not to be adequate, refresh the data stored in the memory cells of the group.

9. A reprogrammable non-volatile memory system, comprising:
- a plurality of groups of charge storage memory cells connected in a manner that accessing less than all of the memory cells in the group can disturb the levels of charge stored in other memory cells in the group, and
- a controller connected with the charge storage memory cells and that operates to:
    - recognize when less than all the memory cells of the group have been accessed and the data stored therein have been read in response to a command,
    - determine whether some of the memory cells within the group have a higher degree of vulnerability to being disturbed by the commanded data read than other memory cells of the group, and, if so, identify memory cells within the group that have the higher degree of vulnerability to being disturbed by distinguishing between the memory cells that have been accessed in response to the command and other memory cells within the group,
    - subsequently initiate a scrub read of data from at least some of the memory cells that have been identified to have the higher degree of vulnerability,
    - determine a level of quality of the scrub read data and whether it is adequate, and
    - if the level of quality of the read data is determined not to be adequate, refresh the data stored in the memory cells of the group.

* * * * *